United States Patent
Kim et al.

(10) Patent No.: US 7,855,758 B2
(45) Date of Patent: Dec. 21, 2010

(54) LIQUID CRYSTAL DISPLAY DEVICE

(75) Inventors: Young-II Kim, Suwon-si (KR); Won-Sang Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 193 days.

(21) Appl. No.: 12/328,246

(22) Filed: Dec. 4, 2008

(65) Prior Publication Data

US 2009/0262270 A1  Oct. 22, 2009

(30) Foreign Application Priority Data

Apr. 16, 2008  (KR) .................. 10-2008-0035320

(51) Int. Cl.
  *G02F 1/136* (2006.01)
  *G09G 3/30* (2006.01)
  *H01L 29/04* (2006.01)
(52) U.S. Cl. .......................... 349/39; 257/71
(58) Field of Classification Search ............... 257/51, 257/59, 71, 347, 72, 88; 349/39, 42, 43, 349/144
See application file for complete search history.

(56) References Cited

U.S. PATENT DOCUMENTS

| 7,220,992 B2 * | 5/2007 | Kim et al. | 257/59 |
| 7,564,060 B2 * | 7/2009 | Sung et al. | 257/72 |
| 7,733,434 B2 * | 6/2010 | Kim et al. | 349/48 |
| 2006/0027813 A1 * | 2/2006 | Kim et al. | 257/72 |
| 2006/0286703 A1 * | 12/2006 | Um et al. | 438/30 |
| 2007/0242176 A1 * | 10/2007 | Chang et al. | 349/42 |
| 2010/0053490 A1 * | 3/2010 | Kang et al. | 349/48 |

* cited by examiner

*Primary Examiner*—Akm E Ullah
(74) *Attorney, Agent, or Firm*—Cantor Colburn LLP

(57) ABSTRACT

A display device includes a substrate; a gate line disposed on the substrate; a data line disposed on the substrate; a driving voltage line disposed on the substrate; a first thin film transistor disposed on the substrate; a second thin film transistor disposed on the substrate; a first semiconductor having an extending region of a storage electrode connected between an output terminal of the first thin film transistor and an control terminal of the second thin film transistor; a transparent conductor of a storage electrode connected to the driving voltage line and overlaps the extending region of the storage electrode; and a pixel electrode connected to an output terminal of the second thin film transistor and overlaps the transparent conductor of the storage electrode. Accordingly, an aperture ratio of the display device may be increased.

17 Claims, 6 Drawing Sheets

FIG.2

|   |   | Group |   |   |
|---|---|---|---|---|
| B | W | B | W | B |
| G | R | G | R | G |
| B | W | B | W | B |
| G | R | G | R | G |
| B | W | B | W | B |

LIQUID CRYSTAL DISPLAY DEVICE

This application claims priority to Korean Patent Application No. 10-2008-0035320, filed on Apr. 16, 2008, and all the benefits accruing therefrom under 35 U.S.C. §119, the contents of which in its entirety are herein incorporated by reference.

BACKGROUND OF THE INVENTION

1. Field of the Invention

The present invention relates to a display device. More particularly, the present invention relates to a liquid crystal display device with increased aperture ratio for increasing the lifespan of the display device.

2. Description of the Related Art

A flat panel display is a display device that is thin is size compared to conventional display devices. A liquid crystal display ("LCD"), a plasma display panel ("PDP"), an organic light emitting device ("OLED") and an electrophoretic display ("EPD") are widely used display devices with a flat panel display.

The LCD is the most commonly used display device. The LCD includes two substrates with electrodes disposed thereon and a liquid crystal layer interposed between the two substrates. In the LCD, a voltage is applied to the electrodes to rearrange liquid crystal molecules of the liquid crystal layer. As a result, light transmittance, which passes through the liquid crystal layer, is controlled. The PDP is a display device for displaying images by using plasma generated by a gas discharge. The EPD is a display device utilizing electrophoretic phenomenon to repeatedly write or erase information including symbols such as characters and numbers, for example. In the OLED, electrons and holes are injected into an organic illumination layer, respectively, from a cathode (electron injection electrode) and an anode (hole injection electrode). The injected electrons and holes are combined to generate excitons, which illuminate when converting from an excited state to a ground state. Technologies for improving the performance of the display devices have been repeatedly incorporated. However, conventional display devices transmit light with increased brightness and reduced aperture ratio. Accordingly, the lifespan of the display devices is reduced. Thus, it is desired to develop a display device with increased aperture ratio of the display device in order to increase the lifespan of the liquid crystal display device.

BRIEF SUMMARY OF THE INVENTION

A display device according to an exemplary embodiment of the present invention includes a substrate; a gate line disposed on the substrate; a data line disposed on the substrate; a driving voltage line disposed on the substrate; a first thin film transistor disposed on the substrate, and including an input terminal connected to the data line, an output terminal, and a control terminal connected to the gate line; a second thin film transistor formed on the substrate, and including an input terminal, an output terminal and a control terminal; a first semiconductor having an extending region of a storage electrode connected between the output terminal of the first thin film transistor and the control terminal of the second thin film transistor; a transparent conductor of a storage electrode connected to the driving voltage line and overlaps the extending region of the storage electrode; and a pixel electrode connected to the output terminal of the second thin film transistor and overlaps the transparent conductor of the storage electrode.

The first semiconductor may further include a intrinsic region which overlaps the control terminal of the first thin film transistor, an extrinsic region connected to a first side of the intrinsic region and including a first region which overlaps the input terminal of the first thin film transistor and a second region connected to a second side of the intrinsic region, and the second region connected to the extending region of the storage electrode as an output terminal of the first thin film transistor.

The display device may further include an organic light emitting member disposed on the pixel electrode, and a common electrode disposed on the organic light emitting member.

The extending region of the storage electrode may include a transparent material.

The area of the transparent conductor may be equal to or less than the area of the extending region.

The pixel electrode may include a transparent material, and the common electrode includes a reflective metal.

A display device according to another exemplary embodiment of the present invention includes a substrate; a first semiconductor disposed on the substrate, and including an intrinsic region, an extrinsic region and an extending region connected to the extrinsic region; a first insulating layer disposed on the first semiconductor; a gate line disposed on the first insulating layer and including a first control electrode which overlaps the intrinsic region of the first semiconductor; a second insulating layer disposed on the gate line; a transparent conductor of a storage electrode disposed on the second insulating layer and overlaps the extending region of the first semiconductor; a third insulating layer disposed on the transparent conductor; a data line disposed on the third insulating layer and connected to the extrinsic region of the first semiconductor; a driving voltage line disposed on the third insulating layer, separated from the data line, and connected to the transparent conductor; an output electrode disposed on the third insulating layer, separated from the data line and the driving voltage line, and receives a signal from the transparent conductor; a fourth insulating layer disposed on the data line, the driving voltage line, and the output electrode; a pixel electrode disposed on the fourth insulating layer, connected to the output electrode, and overlaps the transparent conductor; and an organic light emitting member disposed on the pixel electrode.

The display device may include a plurality of pixels, the transparent conductors are disposed at least one by one in each pixel, and the transparent conductors disposed in neighboring pixels may be isolated.

The display device may further include a second semiconductor including an output extrinsic region connected to the output electrode, an input extrinsic region connected to the transparent conductor, and an intrinsic region disposed between the output extrinsic region and the input extrinsic region; and a second control electrode which overlaps the intrinsic region of the second semiconductor, and connected to the extending region of the first semiconductor to receive a control signal from the extending region.

The organic light emitting member may emit one of red light, green light, blue light, and white light.

The fourth insulating layer may include an organic material including pigments.

A display device according to another exemplary embodiment of the present invention includes a substrate; a gate line disposed on the substrate; a data line disposed on the substrate; a thin film transistor disposed on the substrate and including an input terminal connected to the data line, an output terminal and a control terminal connected to the gate line; a pixel electrode disposed on the substrate; a transparent conductor of a storage electrode connected between the output terminal of the thin film transistor and the pixel electrode; a semiconductor disposed on the substrate and including an extending region of the storage electrode which overlaps the transparent conductor; and a storage electrode line disposed the substrate and connected to a first end portion and a second end portion of the extending region.

A display device according to another exemplary embodiment of the present invention includes a substrate; a semiconductor disposed on the substrate and including an intrinsic region, an extrinsic region, and an extending region of a storage electrode separated from the intrinsic region and the extrinsic region; a transparent conductor of the storage electrode disposed on the semiconductor and overlaps the extending region; and a storage electrode line disposed between the semiconductor and the transparent conductor, and connected to the extending region, wherein the storage electrode line includes a first portion and a second portion separated from each other by a predetermined interval, and is disposed between the first portion and the second portion of the transparent conductor.

The display device may include a first insulating layer disposed on the semiconductor; a gate line disposed on the first insulating layer and a gate electrode and overlaps the intrinsic region of the semiconductor; a second insulating layer disposed on the gate line and the storage electrode line; a third insulating layer disposed on the gate line and the storage electrode line; a data line disposed on the third insulating layer and including a source electrode connected to the extrinsic region of the semiconductor; a drain electrode separated from the source electrode with respect to the gate electrode, wherein a first end portion of the drain electrode is connected to the extrinsic region of the semiconductor and a second end portion of the drain electrode is connected to the transparent conductor; a fourth insulating layer disposed on the data line and the drain electrode, a pixel electrode disposed on the fourth insulating layer and connected to the transparent conductor to receive data signals; a liquid crystal layer disposed on the pixel electrode; and a common electrode disposed on the liquid crystal layer, wherein the transparent conductor is disposed between the second insulating layer and the third insulating layer.

The extending region may include a transparent material which transmits light therethrough, and the transparent conductor displays images.

The area of the transparent conductor may be equal to or less than the area of the extending region.

BRIEF DESCRIPTION OF THE DRAWINGS

The above and other aspects, features and advantages of the present invention will become more readily apparent by describing in further detail exemplary embodiments thereof with reference to the accompanying drawings, in which:

FIG. 2 is a schematic diagram of an arrangement of a plurality of pixels in an organic light emitting device according to an exemplary embodiment of the present invention.

DETAILED DESCRIPTION OF THE INVENTION

Figure 1:
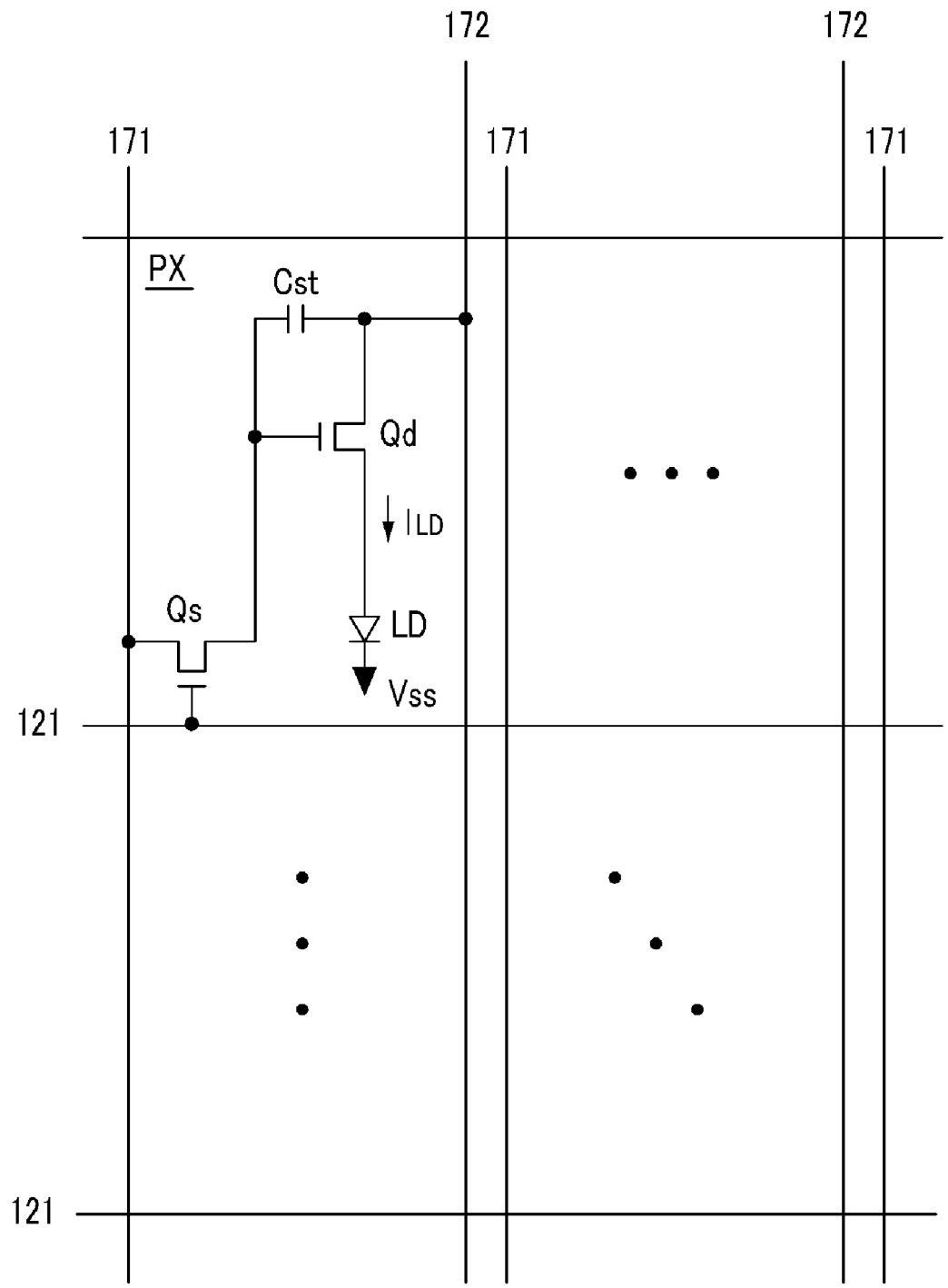
FIG. 1 is a circuit diagram of an organic light emitting device according to an exemplary embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, an organic light emitting device according to an exemplary embodiment of the present invention will be described in further detail with reference to FIG. 1.

FIG. 1 is a circuit diagram of an organic light emitting device according to an exemplary embodiment of the present invention.

Referring to FIG. 1, the organic light emitting device includes a plurality of signal lines and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row and parallel to each other. The data lines 171 and the driving voltage lines 172 extend substantially in a column and parallel to each other.

Each pixel PX includes a switching transistor Qs, a driving transistor Qd, a storage capacitor Cst and an organic light emitting element which functions as an organic light emitting diode (OLED) LD.

The switching transistor Qs in each pixel PX has a control terminal connected to one of the gate lines 121, an input terminal connected to one of the data lines 171 and an output terminal connected to the driving transistor Qd. The switching transistor Qs transmits data signals applied to the data line 171 to the driving transistor Qd in response to a gate signal applied to the gate line 121.

The driving transistor Qd has a control terminal connected to the switching transistor Qs, an input terminal connected to the driving voltage line 172 and an output terminal connected to the organic light emitting diode LD. The driving transistor Qd drives an output current ILD having a magnitude which depends on the voltage between the control terminal and the output terminal thereof.

Still referring to FIG. 1, the storage capacitor Cst is connected between the control terminal and the input terminal of the driving transistor Qd. The storage capacitor Cst stores a data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage Vss. The organic light emitting diode LD emits light having an intensity which depends on an output current ILD of the driving transistor Qd. As a result, images are displayed.

The switching transistor Qs and the driving transistor Qd are n-channel field effect transistors ("FETs"). However, at least one of the switching transistor Qs and the driving transistor Qd may be a p-channel FET. In addition, the connections among the transistors Qs and Qd, the capacitor Cst and the organic light emitting diode LD may be modified.

Figure 2:
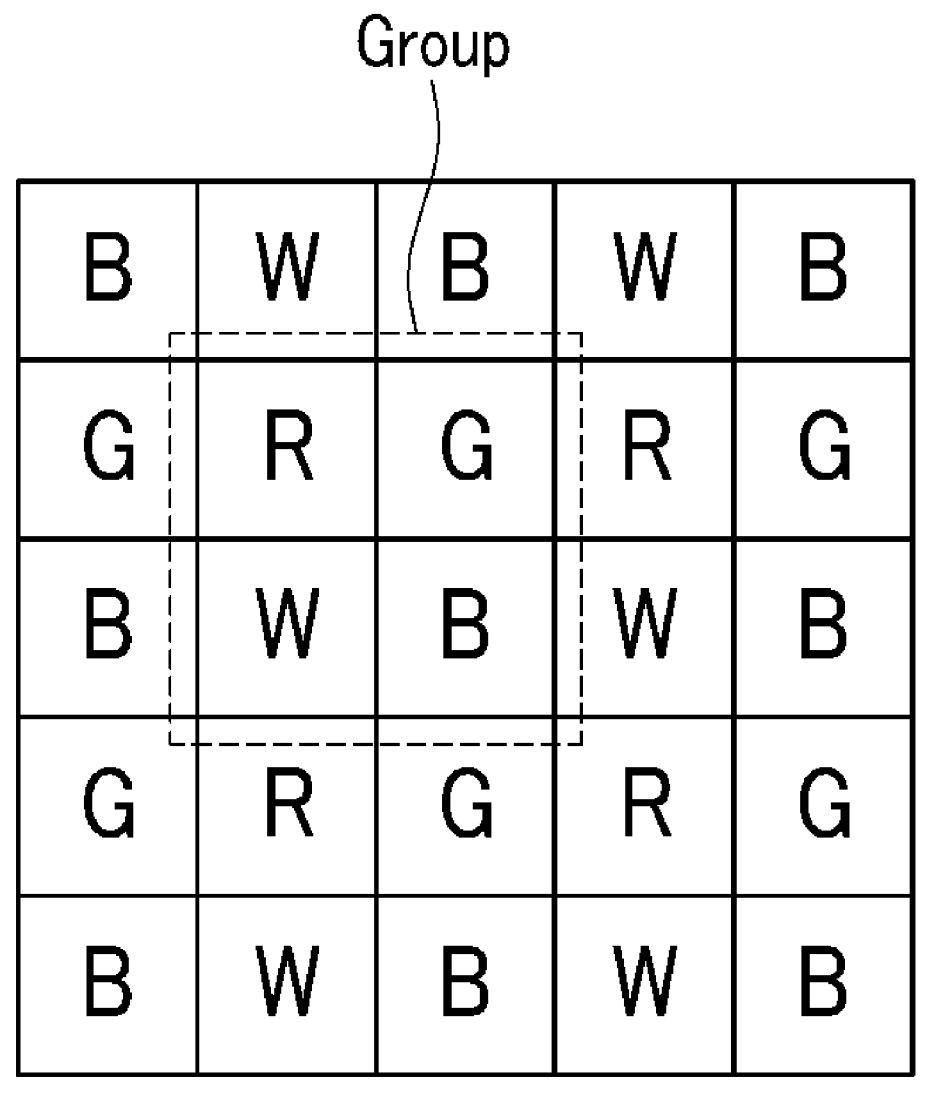

FIG. 2 is a schematic diagram of an arrangement of a plurality of pixels in the organic light emitting device according to an exemplary embodiment of the present invention. Referring to FIG. 2, the organic light emitting device includes red pixels R for displaying a red color, green pixels G for displaying a green color, blue pixels B for displaying a blue color and white pixels W for displaying a white color. The red pixels R, green pixels G, blue pixels B and white pixels W are sequentially and alternately disposed. Four pixels including a red pixel R, a green pixel G, a blue pixel B and a white pixel W form one group and may be repeatedly arranged according to rows and/or columns. However, the arrangement and the shape of the pixels are not limited thereto and may be variously changed. The organic light emitting device includes the white pixels W to improve luminance. The organic light emitting device further includes the red pixels R, the green pixels G and the blue pixels B to display full colors. Alternatively, the white pixels W may be omitted.

Hereinafter, detailed structure of the organic light emitting device of FIG. 1 and FIG. 2 will be described with reference to FIG. 3 and FIG. 4, as well as FIG. 1 and FIG. 2.

Figure 3:
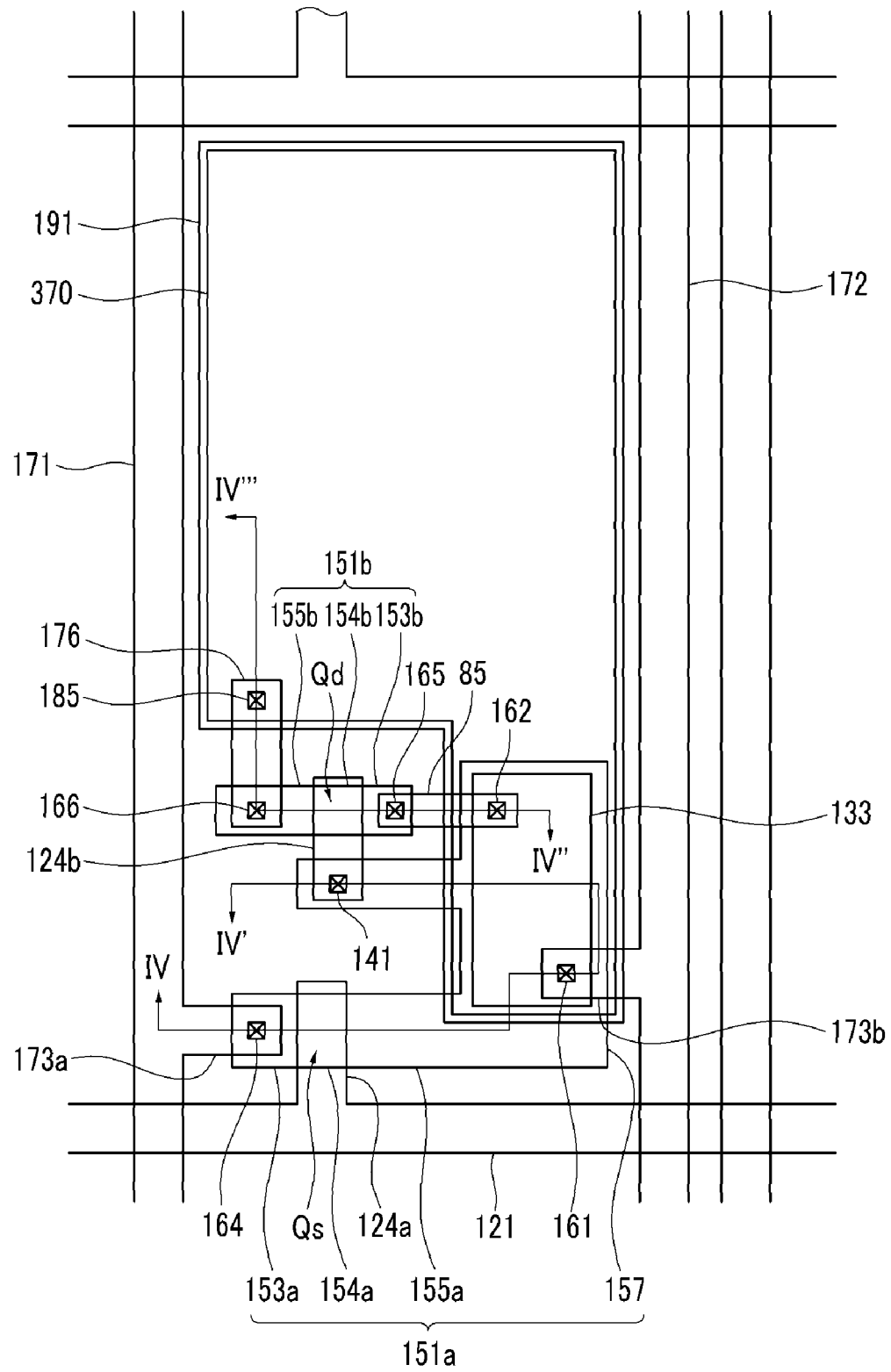
FIG. 3 is a layout view of an organic light emitting device according to an exemplary embodiment of the present invention.
Figure 4:
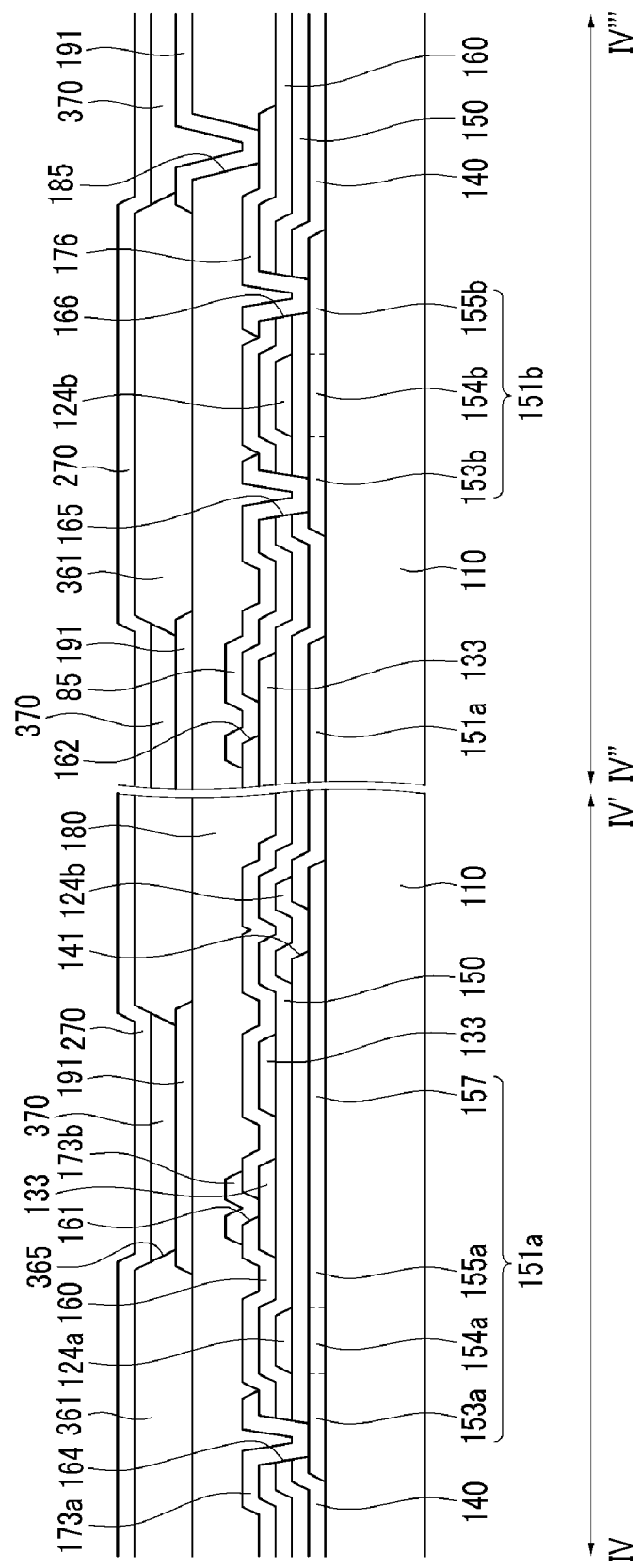
FIG. 4 is a partial cross-sectional view of the organic light emitting device in FIG. 3 taken along line IV-IV'''.

FIG. 3 is a layout view of an organic light emitting device according to an exemplary embodiment of the present invention, and FIG. 4 is a partial cross-sectional view of the organic light emitting device in FIG. 3 taken along line IV-IV.

Referring to FIGS. 3 and 4, a first semiconductor 151a and a second semiconductor 151b, which may include polysilicon, are disposed on a substrate 110. The substrate 110 includes a material such as transparent glass, for example. The first semiconductor 151a and the second semiconductor 151b include a plurality of extrinsic regions including n-type or p-type conductive impurities, and at least one intrinsic region that does not include conductive impurities.

In further detail, the first semiconductor 151a includes an extrinsic region. The extrinsic regions include a first source region 153a, a first drain region 155a separated from the first source region 153a and an extending region 157 of a storage electrode. The extending region 157 is doped with n-type impurities and has an area wider than the area of the first source region 153a. The extending region 157 is also connected to the first drain region 155a and includes a quadrangular shape portion and a portion protruded therefrom. The intrinsic region includes a first channel region 154a and is disposed between the first source region 153a and the first drain region 155a.

In the second semiconductor 151b, the extrinsic region includes a second source region 153b and a second drain region 155b, which are both doped with p-type impurities and separated from each other. The intrinsic region includes a second channel region 154b disposed between the second source region 153b and the second drain region 155b.

The extrinsic region further includes lightly doped regions disposed between the first channel region 154a and the second channel region 154b, and the first source region 153a, first drain region 155a, second source region 153b and second drain region 155b. The lightly doped regions may be formed at offset regions that do not include impurities.

Alternatively, the extrinsic regions, which include the first source region 153a and first drain region 155a, and the extending region 157 of the first semiconductor 151a may be doped with p-type impurities. The extrinsic regions, which include the second source region 153b and second drain region 155b, of the second semiconductor 151b may be doped with n-type impurities.

Still referring to FIGS. 3 and 4, a gate insulating layer 140 (as shown in FIG. 4), which include silicon nitride or silicon oxide, is disposed on the first semiconductor 151a and the second semiconductor 151b. The gate insulating layer 140 has a contact hole 141 exposing the extending region 157 of the first semiconductor 151a.

A gate conductor including the gate lines 121 (as shown in FIG. 3), and a first control electrode 124a and a second control electrode 124b are disposed on the gate insulating layer 140.

The gate lines 121 transmit gate signals and substantially extend in a transverse direction. The first control electrode 124a extends upward from the gate line 121. As a result, the first control electrode 124a overlaps the first semiconductor 151a and the first channel region 154a. The gate lines 121 may include an end portion having a large area for contacting another layer or an external driving circuit. When a gate driving circuit (not shown), which generates gate signals, is disposed directly on the substrate 110, the gate lines 121 may extend and directly connect to the gate driving circuit.

The second control electrode 124b is separated from the gate lines 121 and overlaps the second channel region 154b of the second semiconductor 151b. The second control electrode 124b is extended. The extended portion of the second control electrode 124b is connected to a protruded portion of the extending region 157 of the first semiconductor 151a through the contact hole 141 of the gate insulating layer 140.

A first interlayer insulating layer 150 includes an inorganic insulator and is disposed on the gate conductor, which includes the gate lines 121, first control electrode 124a and second control electrode 124b.

A transparent conductor 133 for a storage electrode is disposed on the first interlayer insulating layer 150. The transparent conductor 133 includes a transparent material such as, indium tin oxide ("ITO") or indium zinc oxide ("IZO"), and overlaps the extending region 157 of the first semiconductor 151a. The area of the transparent conductor 133 may be equal to or less than the area of the extending region 157. The transparent conductors 133 are disposed one by one for each pixel and isolated from each other. The transparent conductor 133 also has a quadrangle shape, but is not limited thereto.

A second interlayer insulating layer 160 is disposed on the transparent conductor 133. The second interlayer insulating layer 160 may include an inorganic insulator, an organic insulator, an insulator having a low dielectric constant or the like.

The second interlayer insulating layer 160 has contact holes 161 and 162 exposing the transparent conductors 133. The second interlayer insulating layer 160, the first interlayer insulating layer 150 and the gate insulating layer 140 have a plurality of contact holes 164, 165, and 166 respectively exposing the first source region 153a of the first semiconductor 151a, and the second source region 153b and the second drain region 155b of the second semiconductor 151b.

A plurality of data conductors, which includes a data line 171, a driving voltage line 172, a connecting member 85 and an output electrode 175, are disposed on the second interlayer insulating layer 160.

The data lines 171 transmit data signals and extend in a longitudinal direction. As a result, the data lines 171 intersect the gate lines 121. Each of the data lines 171 includes a first input electrode 173a connected to the first source region 153a through the contact hole 164, and may include an end portion having a large area for contact with another layer or an external driving circuit. The data signal is applied to the first drain region 155a and the extending region 157 of the first semiconductor 151a through the contact hole 164. The data signal is further transmitted to the second control electrode 124b through the contact hole 141. The first drain region 155a of the first semiconductor 151a functions as an output terminal of the switching transistor Qs.

The driving voltage lines 172 transmit a driving voltage and extend in a longitudinal direction. As a result, the driving voltage lines 172 intersect the gate lines 121. The driving voltage lines 172 include a second input electrode 173b connected to the transparent conductor 133 through the contact hole 161.

The connecting member 85 is connected to the transparent conductor 133 and the second source region 153b through the contact holes 162 and 165.

An output electrode 176 is separated from the data lines 171 and the driving voltage lines 172, and is connected to the second drain region 155b through the contact hole 166. The output electrode 176 receives the driving voltage of the driving voltage lines 172 through the second input electrode 173b, the transparent conductor 133 and the connecting member 85.

The data conductors, which include the connecting member 85, the data lines 171, the driving voltage lines 172, the first input electrode 173a and the output electrode 175, may include a refractory metal such as molybdenum, chromium, tantalum and titanium, or alloys thereof.

A passivation layer 180 (as shown in FIG. 4) is disposed on the data conductors, which includes the connecting member 85, the data line 171, the driving voltage line 172, the first input electrode 173a and the output electrode 175. The passivation layer 180 may have a flat surface and include an inorganic material, an organic material or an insulating material with a low dielectric constant. When the passivation layer 180 includes an inorganic material, a color filter (not shown) and a capping layer (not shown) may be additionally disposed thereon. The passivation layer 180 may also include an organic material including pigments and may display one of three primary colors, such as red, green or blue.

The passivation layer 180 also has a contact hole 185 exposing the output electrode 176 and may have a plurality of contact holes (not shown) exposing the end portion of the data lines 171. In addition, the passivation layer 180 and the first interlayer insulating layer 150 and second interlayer insulating layer 160 may have a plurality of contact holes (not shown) exposing the end portion of the gate lines 121.

Still referring to FIGS. 3 and 4, a pixel electrode 191, which includes a transparent conductive material such as ITO or IZO, is disposed on the passivation layer 180. The pixel electrode 191 overlaps the extending region 157 of the first semiconductor 151a and the transparent conductor 133. The pixel electrode 191 also is physically and electrically connected to the output electrode 176 through the contact hole 185.

A partition 361 is disposed on the passivation layer 180. The partition 361 encloses edges of the pixel electrode 191 and defines an opening 365 of the pixel electrode 191. The partition 361 also includes an organic insulator or an inorganic insulator and may be a photoresist including black pigments.

An organic light emitting member 370 is disposed in the opening 365 defined by the partition 361 on the pixel electrode 191. The organic light emitting member 370 as an emission layer includes an organic material emitting light of one of three primary colors, such as, red, green and blue, but is not limited thereto. The organic light emitting device may include an emission layer (not shown), which emits white light to improve luminance. The white light may be emitted by mixing light emitted from the emitting layer 370 which is formed by forming sub-emitting layers through sequentially stacking materials emitting red, green, and blue light. The sub-emitting layers may be formed with various color combinations that emit the white light. For example, the organic light emitting device may additionally include a color filter (not shown). The emission layer may include the opening 365 of the partition 361 and may be disposed on the whole surface of the partition 361.

The organic light emitting member 370 may have a multi-layered structure including the emission layer (not shown) and an auxiliary layer (not shown) for improving efficiency of light emission of the emitting layer. The auxiliary layer may include one of an electron transport layer (not shown) and a hole transport layer (not shown) which achieve a balance of electrons and holes, and an electron injection layer (not shown) and a hole injection layer (not shown) which reinforce the injection of the electrons and the holes.

A common electrode 270 is disposed on the organic light emitting member 370. The common electrode 270 receives a common voltage Vss and may include a reflective metal such as calcium (Ca), barium (Ba), magnesium (Mg), silver (Ag), aluminum (Al), their alloys, and the like.

In the organic light emitting device, the first semiconductor 151a, the first control electrode 124a and the first input electrode 173a form the switching thin film transistor Qs. A channel of the switching thin film transistor Qs is disposed on the first channel region 154a of the first semiconductor 151a. The second semiconductor 151b, the second control electrode 124b connected to the extending region 157 of the first semiconductor 151a, the second input electrode 173b and the output electrode 176 form the driving thin film transistor Qd. The channel of the driving thin film transistor Qd is disposed on the second channel region 154b of the second semiconductor 151b. A pixel electrode 191, an organic light emitting member 370, and the common electrode 270 form an organic light emitting element having the pixel electrode 191 as an anode and the common electrode 270 as a cathode, or vice versa. The transparent conductor 133 and the extending region 157 of the first semiconductor 151a, which overlaps each other, form the storage capacitor Cst.

In the organic light emitting device, the light is emitted toward a lower part of the substrate 110 to display images. That is, the organic light emitting device according to an exemplary embodiment of the present invention is a bottom emission type.

Still referring to FIGS. 3 and 4, the pixel electrode 191 overlaps the transparent conductor 133. The transparent conductor 133, which is used as a storage capacitor, and the extending region 157 of the first semiconductor 151a are transparent. As a result, an aperture ratio is increased.

Also, the increased aperture ratio may be obtained such that energy efficiency of the organic light emitting member 370 is increased and the lifespan of the display device is increased.

Hereinafter, a manufacturing method of the organic light emitting device according to an exemplary embodiment of the present invention will be described with reference to FIG. 4.

The first semiconductor 151a and the second semiconductor 151b including the intrinsic regions (the first channel region 154a and the second channel region 154b), the extrinsic regions (first source region 153a, the first drain region 155a, second source region 153b and second drain region 155b) and the extending regions 157, the gate insulating layer 140, the gate conductors including the gate lines 121, the first control electrode 124a and second control electrode 124b, and the first interlayer insulating layer 150 are sequentially disposed on the substrate 110. Next, the transparent conductors 133, which overlap the extending regions 157 of the first semiconductor 151a, are disposed on the first interlayer insulating layer 150, and the second interlayer insulating layer 160 is disposed thereon. The data conductors, which include the data lines 171 and the first input electrode 173a and second input electrode 173b, the driving voltage line 172, the connecting member 85 and the output electrodes 176 are disposed on the second interlayer insulating layer 160. Then, the passivation layer 180, the pixel electrode 191, the partition 361, the organic light emitting member 370 and the common electrode 270 are sequentially disposed on the data conductors.

A liquid crystal display according to another exemplary embodiment of the present invention will now be described with reference to FIG. 5 and FIG. 6.

Figure 5:
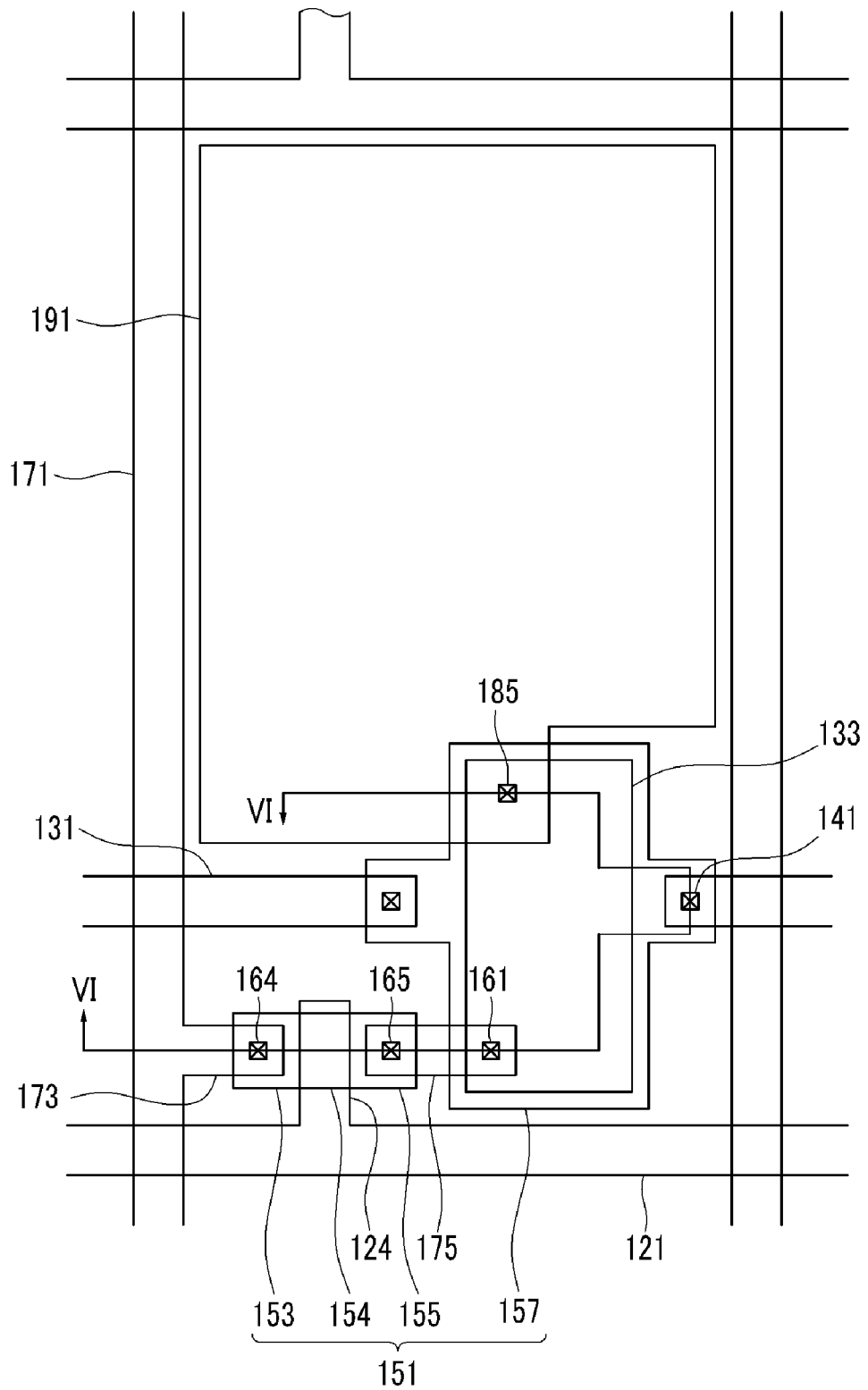
FIG. 5 is a layout view of a liquid crystal display according to another exemplary embodiment of the present invention.
Figure 6:
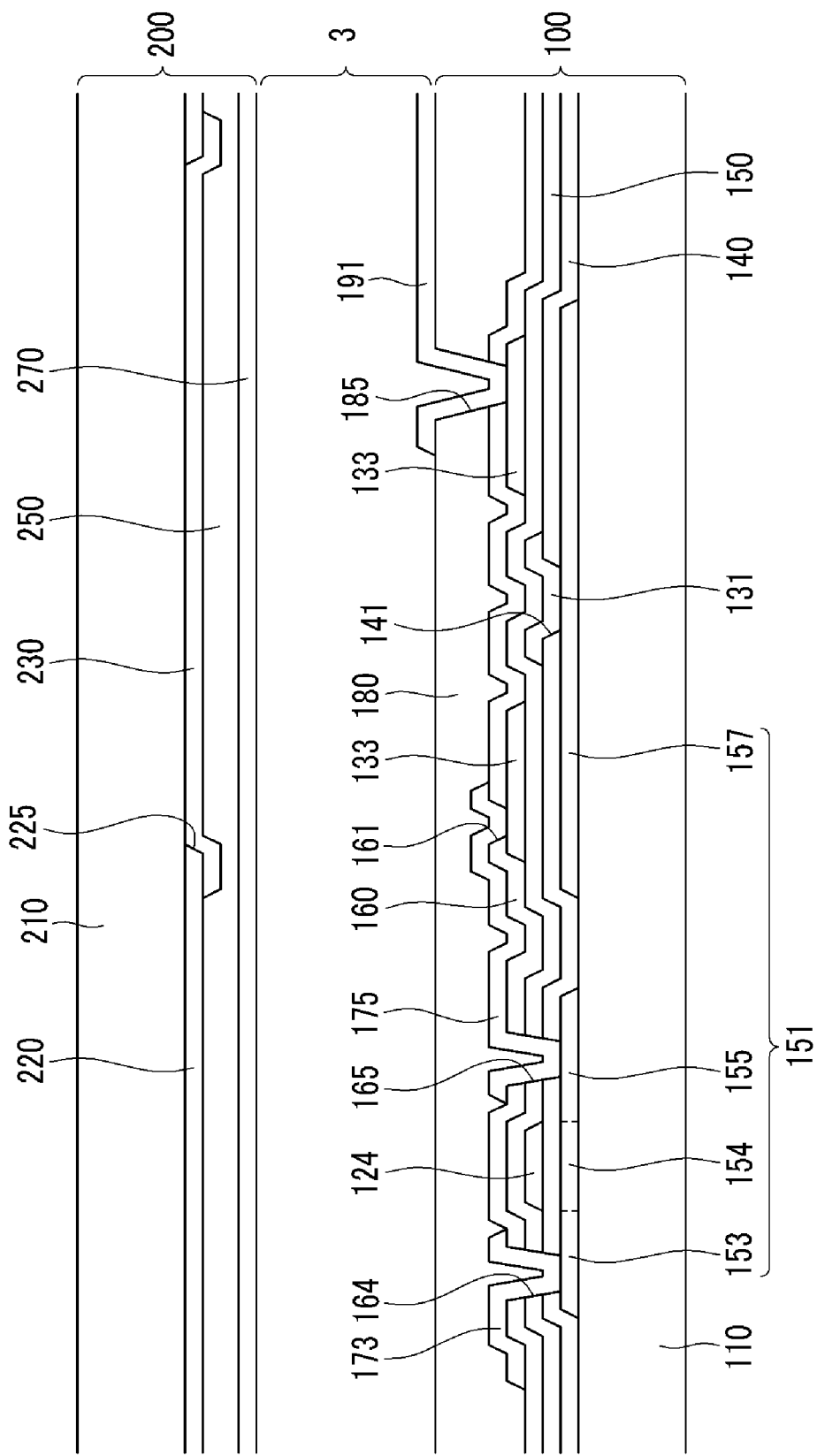
FIG. 6 is a partial cross-sectional view of the liquid crystal display in FIG. 5 taken along line VI-VI.

FIG. 5 is a layout view of a liquid crystal display according to another exemplary embodiment of the present invention, and FIG. 6 is a partial cross-sectional view of the liquid crystal display shown in FIG. 5 taken along line VI-VI.

Referring to FIG. 5 and FIG. 6, the liquid crystal display includes a thin film transistor array panel 100, a common electrode panel 200 facing the thin film transistor array panel 100, and a liquid crystal layer 3 interposed between the thin film transistor array panel 100 and the common electrode 200.

Hereinafter, the thin film transistor array panel 100 will be described with reference to FIGS. 5 and 6.

The thin film transistor array panel 100 includes a semiconductor 151 including polysilicon and is disposed on a substrate 110 having a material such as transparent glass. The semiconductor 151 includes extrinsic regions and an extending region 157 for a storage electrode, which have n-type or p-type conductive impurities. The semiconductor 151 also includes at least one intrinsic region that does not include conductive impurities. The extrinsic region is doped with an n-type impurity and includes a source region 153 and a drain region 155 separated from the source region 153. The extending region 157 for the storage electrode is separated from the source region 153 and drain region. Thus, the extending region 157 is doped with an n-type impurity similarly to the source region 153 and drain region 155. The intrinsic region includes a channel region 154 and is disposed between the source region 153 and the drain region 155.

The extrinsic region may further include lightly doped regions disposed between the channel region 154, and the source region 153 and drain region 155.

The thin film transistor array panel 100 further includes a gate insulating layer 140 disposed on the semiconductor 151. The gate insulating layer 140 includes a contact hole 141 exposing the extending region 157 of the semiconductor 151.

A gate conductor, which includes a gate line 121, is disposed on the gate insulating layer 140. The gate line 121 further includes a gate electrode and storage electrode lines 131. The gate conductor may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, nitrides thereof, or chromium (Cr), tantalum (Ta), titanium (Ti) or the like. However, the gate conductor may have a multi-layered structure including two conductive layers (not shown) having different physical properties.

The gate line 121 transmits gate signals and extends in a transverse direction. The gate electrode 124 extends upward from the gate line 121. As a result, the gate electrode overlaps the semiconductor 151 and the channel region 154. The gate line 121 includes an end portion having a large area for contact with another layer or an external driving circuit.

The storage electrode line 131 is disposed intermittently and traces the direction of the gate line 121. Disconnected portions of the storage electrode lines 131 are disposed in each pixel one by one. For example, the storage electrode lines 131 may be divided into a first portion and a second portion, which are separated from each other in one pixel with a predetermined interval therebetween. The extending region 157 of the semiconductor 151 is disposed between the first portion and the second portion of the storage electrode lines 131. However, most of the extending region 157 does not overlap the storage electrode lines 131. The end portions of the storage electrode lines 131 are connected to the extending regions 157 through the contact holes 141.

The first interlayer insulating layer 150 also includes an inorganic insulator. The first interlayer insulating layer 150 is disposed on the gate conductors, which includes the gate line 121, the gate electrode 124 and the storage electrode lines 131.

A transparent conductor 133, which includes ITO or IZO, is disposed on the first interlayer insulating layer 150. The transparent conductor 133 is disposed between the first portion and the second portion of the storage electrode lines 131. As a result, the transparent conductor 133 overlaps the extending region 157 of the semiconductor 151 and does not overlap the storage electrode lines 131.

A second interlayer insulating layer 160 is disposed on the transparent conductor 133. The second interlayer insulating layer 160 includes an inorganic insulator, an organic insulator or an insulator having a low dielectric constant.

The second interlayer insulating layer 160 further has a contact hole 161 exposing the transparent conductor 133. Further, the second interlayer insulating layer 160, the first interlayer insulating layer 150 and the gate insulating layer 140 include a plurality of contact holes 164 and 165 exposing the source region 153 and drain region 155 of the semiconductor 151.

A data line 171 and a drain electrode 175 (as shown in FIG. 5) are disposed on the second interlayer insulating layer 160.

The data line 171 transmits data signals and extends substantially in a longitudinal direction. As a result, the data line 171 intersects the gate line 121. The data line 171 includes a source electrode 173 connected to the source region 153 of the semiconductor 151 through the contact hole 164.

The drain electrode 175 is separated from the data line 171. The drain electrode 175 is also disposed opposite to the source electrode 173, with respect to the gate electrode 124. A first end portion of the drain electrode 175 is connected to the drain region 155 of the semiconductor 151 through the contact hole 165. A second end portion of the drain electrode 175 is connected to the transparent conductor 133 through the contact hole 161.

The data conductors, which include the data line 171 and the drain electrode 175, may include a refractory metal such as molybdenum, chromium, tantalum, and titanium or alloys thereof, for example.

The thin film transistor array panel 100 also includes a passivation layer 180 which is disposed on the data line 171 and the drain electrode 175 of the data conductors. The passivation layer 180 may have a flat surface and includes an inorganic material, an organic material or an insulating material with a low dielectric constant.

The passivation layer 180 and the second interlayer insulating layer 160 have a contact hole 185 exposing the transparent conductor 133.

A pixel electrode 191, which includes a transparent conductive material such as ITO or IZO, is disposed on the passivation layer 180. The pixel electrode 191 is physically and electrically connected to the transparent conductor 133 through the contact hole 185.

A signal from the data line 171 is transmitted to the transparent conductor 133 through the source electrode 173 and drain electrode 175, and further to the pixel electrode 191 through the contact hole 185.

The gate electrode 124, the source electrode 173 and the drain electrode 175 form one thin film transistor along with the semiconductor 151. A channel of the thin film transistor is disposed in the channel region 154 of the semiconductor 151.

The extrinsic region of the semiconductor 151 includes the transparent conductor 133 and extending region 157, which overlaps each other and form a storage capacitor Cst.

Hereinafter, the common electrode panel 200 will be described with reference to FIGS. 5 and 6.

The common electrode panel 200 includes a light blocking member 220 which is disposed on a substrate 210. The light blocking member 220 has a plurality of openings 225 facing the pixel electrodes 191. The light booking member 220 also includes a shape similarly to the pixel electrodes 191. As a result, the light booking member 220 blocks light leakage between the pixel electrodes 191.

An overcoat 250 is disposed on the substrate 210 and the light blocking member 220. The overcoat 250 has a flat surface and may include an insulating material. Alternatively, the overcoat 250 may be omitted from the substrate 210.

The common electrode panel 200 further includes a common electrode 270 which is disposed on the overcoat 250. The common electrode 270 includes a transparent conductor such as ITO or IZO, for example.

A color filter 230 is disposed between the substrate 210 and the overcoat 250. The overcoat 250 prevents the color filter 230 from being exposed. The color filter 230 mainly exists in the opening 225 of the light blocking member 220 and may display one of three primary colors, such as red, green, and blue, for example. Alternatively, the color filter 230 may be disposed on the thin film transistor display panel 100.

A liquid crystal layer 3 is disposed between the common electrode panel 200 and the thin film transistor array panel 100.

The liquid crystal display further includes a light source (not shown) disposed on the common electrode panel 200 or under the thin film transistor array panel 100. Accordingly, the liquid crystal display may display an image through a front surface or a rear surface according to the position of the light source.

Alternatively, the semiconductor 151 may include amorphous silicon. As a result, the semiconductor 151 does not include the extrinsic region. However, ohmic contacts (not shown) that are made of n+ hydrogenated amorphous silicon with an n-type impurity at a high concentration may be disposed between the semiconductor 151 and the data line 171, source electrode 173 and drain electrode 175 of the data conductors.

Further, the gate electrode 124 may be disposed under the semiconductor 151, and the gate insulating layer 140 may be disposed between the semiconductor 151 and the gate electrode 124. Thus, the data line 171, source electrode 173 and drain electrode 175 of the data conductors may be directly disposed on the gate insulating layer 140.

Also, the data line 171, source electrode 173, and drain electrode 175 may be disposed under the semiconductor 151 and electrically contact the semiconductor 151 thereon.

According to an exemplary embodiment of the present invention, the transparent conductor 133, which is used as the storage capacitor, and the extending region 157 of the semiconductor 151 are transparent. As a result, the aperture ratio is increased. Accordingly, the increased aperture ratio increases energy efficiency of the organic light emitting member 370. As a result, the lifespan of the organic light emitting member 370 is increased.

Hereinafter, a manufacturing method of the liquid crystal display will be described with reference to FIGS. 5 and 6.

The semiconductor 151 including the intrinsic region 154, the extrinsic regions 153 and 155 and the extending region 157, the gate insulating layer 140, the gate line 121 having the gate electrode 124 and the storage electrode lines 131 of the gate conductor, and the first interlayer insulating layer 150 are sequentially disposed on the substrate 110. The transparent conductor 133 overlapping the extending region 157 of the semiconductor 151 is disposed on the first interlayer insulating layer 150. The second interlayer insulating layer 160 is disposed thereon. Next, the data line 171 having the source electrode 173 and the drain electrode 175 are disposed on the second interlayer insulating layer 160. The passivation layer 180 and the pixel electrode 191 are disposed on the data line 171 and the drain electrode 175 to complete the thin film transistor array panel 100. Finally, the common electrode panel 200, which includes the light blocking member 220, the color filter 230, the overcoat 250 and the common electrode 270, is combined to the thin film transistor array panel 100. The liquid crystal layer 3 may be dripped on one of the thin film transistor array panel 100 and the common electrode panel 200 before combining the thin film transistor array panel 100 and the common electrode panel 200. Alternatively, the liquid crystal layer 3 may be injected between the thin film transistor array panel 100 and the common electrode panel 200 after the combination thereof.

According to an exemplary embodiment of the present invention, the conductors used as the storage capacitor and the extending region of the semiconductor are transparent such that the aperture ratio may be increased. Accordingly, the increased aperture ratio may be obtained such that energy efficiency is increased in the organic light emitting member 370. As a result, the lifespan of the organic light emitting member 370 may be increased.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit and/or scope of the present invention as defined by the following claims.

What is claimed is:

1. A display device comprising:
a substrate;
a gate line disposed on the substrate;
a data line disposed on the substrate;
a driving voltage line disposed on the substrate;
a first thin film transistor disposed on the substrate and comprising an input terminal connected to the data line, an output terminal and a control terminal connected to the gate line;
a second thin film transistor disposed on the substrate and comprising an input terminal, an output terminal and a control terminal;
a first semiconductor comprising an extending region of a storage electrode connected between the output terminal of the first thin film transistor and the control terminal of the second thin film transistor;
a transparent conductor of a storage electrode connected to the driving voltage line and overlaps the extending region of the storage electrode; and
a pixel electrode connected to the output terminal of the second thin film transistor, and overlaps the transparent conductor of the storage electrode.

2. The display device of claim 1, wherein the first semiconductor further comprises:
an intrinsic region which overlaps the control terminal of the first thin film transistor;
an extrinsic region connected to a first side of the intrinsic region and comprising a first region which overlaps the input terminal of the first thin film transistor and a second region connected to a second side of the intrinsic region; and
the second region connected to the extending region of the storage electrode as an output terminal of the first thin film transistor.

3. The display device of claim 2, further comprising
an organic light emitting member disposed on the pixel electrode, and
a common electrode disposed on the organic light emitting member.

4. The display device of claim 3, wherein
the extending region of the storage electrode comprising a transparent material.

5. The display device of claim 4, wherein the transparent conductor comprises an area which is equal to or less than the area of the extending region.

6. The display device of claim 1, wherein
the pixel electrode comprises a transparent material.

7. The display device of claim 6, wherein
the common electrode comprises a reflective metal.

8. A display device comprising:
a substrate;
a first semiconductor disposed on the substrate and comprising an intrinsic region, an extrinsic region and an extending region connected to the extrinsic region;
a first insulating layer disposed on the first semiconductor;
a gate line disposed on the first insulating layer and comprising a first control electrode, which overlaps the intrinsic region of the first semiconductor;
a second insulating layer disposed on the gate line;
a transparent conductor of a storage electrode disposed on the second insulating layer and overlaps the extending region of the first semiconductor;
a third insulating layer disposed on the transparent conductor;
a data line disposed on the third insulating layer and connected to the extrinsic region of the first semiconductor;
a driving voltage line disposed on the third insulating layer, separated from the data line and connected to the transparent conductor;
an output electrode disposed on the third insulating layer, separated from the data line and the driving voltage line, and receives a signal from the transparent conductor;

a fourth insulating layer disposed on the data line, the driving voltage line and the output electrode;

a pixel electrode disposed on the fourth insulating layer, connected to the output electrode and overlaps the transparent conductor; and an organic light emitting member disposed on the pixel electrode.

9. The display device of claim 8, wherein the display device comprises a plurality of pixels, the transparent conductors are disposed at least one by one in each pixel, and the transparent conductors disposed in neighboring pixels are isolated.

10. The display device of claim 9, further comprising:

a second semiconductor comprising an output extrinsic region connected to the output electrode, an input extrinsic region connected to the transparent conductor and an intrinsic region disposed between the output extrinsic region and the input extrinsic region; and a second control electrode which overlaps the intrinsic region of the second semiconductor and connected to the extending region of the first semiconductor to receive a control signal from the extending region.

11. The display device of claim 8, wherein the organic light emitting member emits one of red light, green light, blue light and white light.

12. The display device of claim 8, wherein the fourth insulating layer comprises an organic material including pigments.

13. A display device comprising:

a substrate;

a gate line disposed on the substrate;

a data line disposed on the substrate;

a thin film transistor disposed on the substrate and comprising an input terminal connected to the data line, an output terminal and a control terminal connected to the gate line;

a pixel electrode disposed on the substrate;

a transparent conductor of a storage electrode connected between the output terminal of the thin film transistor and the pixel electrode;

a semiconductor disposed on the substrate and comprising an extending region of the storage electrode which overlaps the transparent conductor; and a storage electrode line disposed on the substrate and connected to a first end portion and a second end portion of the extending region.

14. A display device comprising:

a substrate;

a semiconductor disposed on the substrate and comprising an intrinsic region, an extrinsic region and an extending region of a storage electrode separated from the intrinsic region and the extrinsic region;

a transparent conductor of the storage electrode disposed on the semiconductor and overlaps the extending region; and a storage electrode line disposed between the semiconductor and the transparent conductor, and connected to the extending region, wherein the storage electrode line comprises a first portion and a second portion separated from each other with a predetermined interval therebetween, and disposed between the first portion and the second portion of the transparent conductor.

15. The display device of claim 14, further comprising:

a first insulating layer disposed on the semiconductor;

a gate line disposed on the first insulating layer and a gate electrode and overlaps the intrinsic region of the semiconductor;

a second insulating layer disposed on the gate line and the storage electrode line;

a third insulating layer disposed on the gate line and the storage electrode line;

a data line disposed on the third insulating layer and comprising a source electrode connected to the extrinsic region of the semiconductor;

a drain electrode separated from the source electrode with respect to the gate electrode, wherein a first end portion of the drain electrode is connected to the extrinsic region of the semiconductor and a second end portion of the drain electrode is connected to the transparent conductor;

a fourth insulating layer disposed on the data line and the drain electrode, a pixel electrode disposed on the fourth insulating layer and connected to the transparent conductor to receive data signals;

a liquid crystal layer disposed on the pixel electrode; and a common electrode disposed on the liquid crystal layer, wherein the transparent conductor is disposed between the second insulating layer and the third insulating layer.

16. The display device of claim 15, wherein the extending region comprises a transparent material which transmits light therethrough; and the transparent conductor displays images.

17. The display device of claim 16, wherein the transparent conductor comprises an area which is equal to or less than the area of the extending region.

* * * * *